US012136795B2

(12) United States Patent
Era (10) Patent No.: US 12,136,795 B2
(45) Date of Patent: Nov. 5, 2024

(54) METHOD FOR PRODUCING PHOTOSEMICONDUCTOR DEVICE (71) Applicant: Mitsubishi Electric Corporation, Tokyo (JP)

(72) Inventor: Atsushi Era, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 632 days.

(21) Appl. No.: 17/600,415

(22) PCT Filed: Jun. 27, 2019

(86) PCT No.: PCT/JP2019/025627
§ 371 (c)(1),
(2) Date: Sep. 30, 2021

(87) PCT Pub. No.: WO2020/261493
PCT Pub. Date: Dec. 30, 2020

(65) Prior Publication Data
US 2022/0190548 A1 Jun. 16, 2022

(51) Int. Cl.
H01S 5/02 (2006.01)
H01S 5/028 (2006.01)
H01S 5/32 (2006.01)

(52) U.S. Cl.
CPC .......... H01S 5/0218 (2013.01); H01S 5/0203 (2013.01); H01S 5/028 (2013.01); H01S 5/3202 (2013.01)

(58) Field of Classification Search
None
See application file for complete search history.

(56) References Cited

U.S. PATENT DOCUMENTS

| 5,068,756 A | * | 11/1991 | Morris | H01L 27/0623 257/E27.012 |
| 6,372,981 B1 | * | 4/2002 | Ueda | H01L 21/02463 257/190 |
| 2022/0190548 A1 | * | 6/2022 | Era | H01L 21/3065 |
| 2024/0191395 A1 | * | 6/2024 | Mikawa | C30B 7/10 |

FOREIGN PATENT DOCUMENTS

| JP | 2002313721 A | * | 10/2002 | ......... H01L 21/0237 |
| JP | 2003-282455 A | | 10/2003 | |
| JP | 2013-222804 A | | 10/2013 | |
| WO | WO-2022068939 A1 | * | 4/2022 | |

OTHER PUBLICATIONS

International Search Report issued in PCT/JP2019/025627; mailed Aug. 27, 2019.

* cited by examiner

Primary Examiner — Michael Lebentritt
(74) Attorney, Agent, or Firm — Studebaker & Brackett PC (57) ABSTRACT A method of manufacturing an optical semiconductor device includes a step of forming semiconductor layers on the surface of an n-type InP substrate; an etching step of forming an active layer ridge by etching part of the semiconductor layers; a cleaning step of removing Si having adhered to the surface of the etched semiconductor layers while feeding a source gas for the crystal growth and an etching gas; and a crystal growth step of forming buried layers along both sidewalls of the active layer ridge at a processing temperature higher than that in the cleaning step, and the cleaning step is performed with the ridge being kept in shape.

20 Claims, 7 Drawing Sheets

METHOD FOR PRODUCING PHOTOSEMICONDUCTOR DEVICE

TECHNICAL FIELD

The present application relates to a method of manufacturing an optical semiconductor device.

BACKGROUND ARTS

In a method of an optical semiconductor device that employs a buried structure for a laser diode and an optical modulator, it has been known that when the semiconductor layers are dry-etched, a Si-based reaction product is produced as etching residue. Moreover, even though the Si residue is removed by a chemical solution, Si in the air adheres when the wafer is subsequently transferred into the chamber for crystal growth; hence, a sufficiently proper surface cannot be obtained. In order not to reduce significantly the maximum light output of the laser diode, it is important that the Si concentration on the sidewalls of the ridge be lower than $1.0 \times 10^{17}/cm^3$.

To cope with this, Patent Document 1 discloses an in-situ etching method in which a halogen-based reactive gas is fed into the chamber of a crystal growth apparatus while annealing the wafer mounted therein. Since the Si cannot be entirely removed only by simply feeding the halogen-based gas, the method employs annealing. Patent Document 2, by contrast, discloses not the method using annealing but a method of removing Si more effectively by feeding both an etching gas and a source gas for crystal growth.

PRIOR ART DOCUMENTS

Patent Documents

Patent Document 1: JP2013-222804A (paragraph [0023]); and
Patent Document 2: JP2003-282455A (paragraph [0079] and Table. 1),

SUMMARY OF THE INVENTION

Problem that the Invention is to Solve

In the method disclosed in Patent Document 1, however, the ridge loses its shape by being annealed at a high temperature, thus posing problems of causing characteristic deterioration of the element and decreasing in manufacturing stability.

Moreover, even in a case of applying the method disclosed in Patent Document 2 not to a wafer having a flat surface but to the wafer after a ridge is formed, since the sidewalls of the ridge are preferentially etched during cleaning, the longer the cleaning is performed to enhance the cleaning effect, the more the ridge loses its shape, thus posing a problem of causing a considerable characteristic deterioration of the element. Adjusting the film thickness changing rate, which is defined by subtracting an etching rate from a growth rate, of the ridge bottom to be zero based on the postulate that the cleaning effect is highest when the film thickness changing rate is near zero, however, the film thickness changing rate of the sidewalls of the ridge is considerably smaller than zero, thus posing a further problem of not sufficiently exhibiting the effect of cleaning the sides of the ridge.

The present application discloses a technology for resolving the above-described problems and is aimed at providing a method of manufacturing an optical semiconductor device that allows for introducing a cleaning with the ridge being kept in shape even when the ridge has been formed on the wafer.

Means for Solving the Problem

A method of manufacturing an optical semiconductor device disclosed in the present application includes a step of forming semiconductor layers on a surface of a substrate; an etching step of forming a ridge by etching part of the semiconductor layers; a cleaning step of removing substances having adhered to surfaces of the etched semiconductor layers while feeding a source gas for crystal growth and an etching gas; and a crystal growth step of forming current blocking layers along both sidewalls of the ridge at a processing temperature higher than a temperature in the cleaning step.

Advantageous Effect of the Invention

According to the present application, a method of manufacturing an optical semiconductor device includes a cleaning step of removing substances having adhered to the surfaces of the etched semiconductor layers at a processing temperature lower than that in a crystal growth step while feeding a source gas for crystal growth and an etching gas, thus being able to perform the cleaning with the ridge being kept in shape.

DETAILED DESCRIPTION OF THE INVENTION

Embodiment 1

Figure 1:
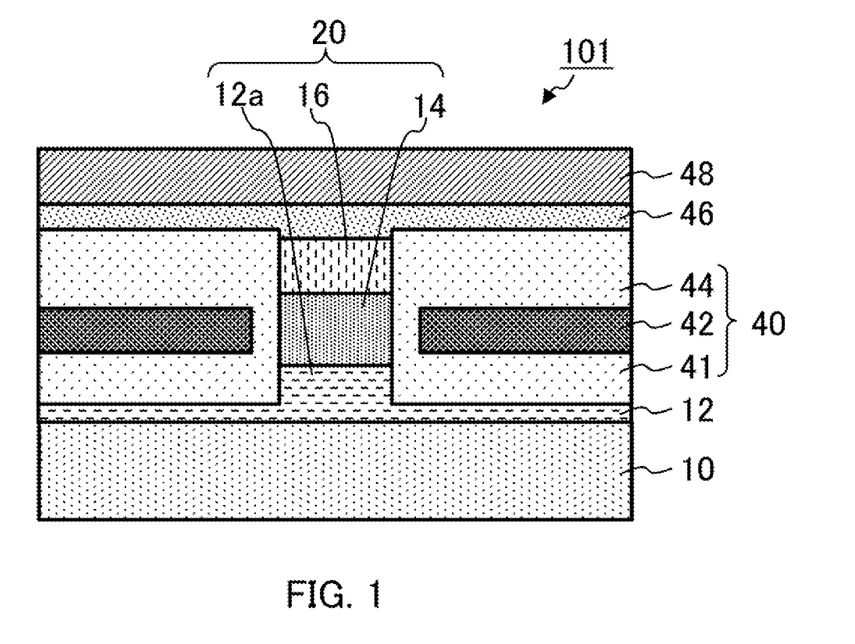
FIG. 1 is a sectional view showing a configuration of an optical semiconductor device manufactured by a method of manufacturing the optical semiconductor device according to Embodiment 1.

FIG. 1 is a sectional view showing a configuration of an optical semiconductor device 101 according to Embodiment 1 of the present invention. Referring to FIG. 1, the optical semiconductor device 101 has a structure such that an n-type InP cladding layer 12 having a protrusion 12a in the middle thereof is formed on an n-type InP substrate 10 and an active layer ridge 20 is formed as a ridge in which an AlGaInAs active layer 14 and a p-type InP cladding layer 16 are sequentially layered on the protrusion 12a of the n-type InP cladding layer 12. On both sidewalls of the active layer ridge 20, buried layers 40 are formed as current blocking layers in which n-type InP current blocking layers 42 are covered with p-type InP current blocking layers 41 and p-type InP current blocking layers 44, and a p-type InP cladding layer 46 is layered on the surfaces of the buried layers 40 and the surface of the active layer ridge 20 and a p-type InGaAs contact layer 48 is layered on the surface of the p-type InP cladding layer 46.

Figure 2:
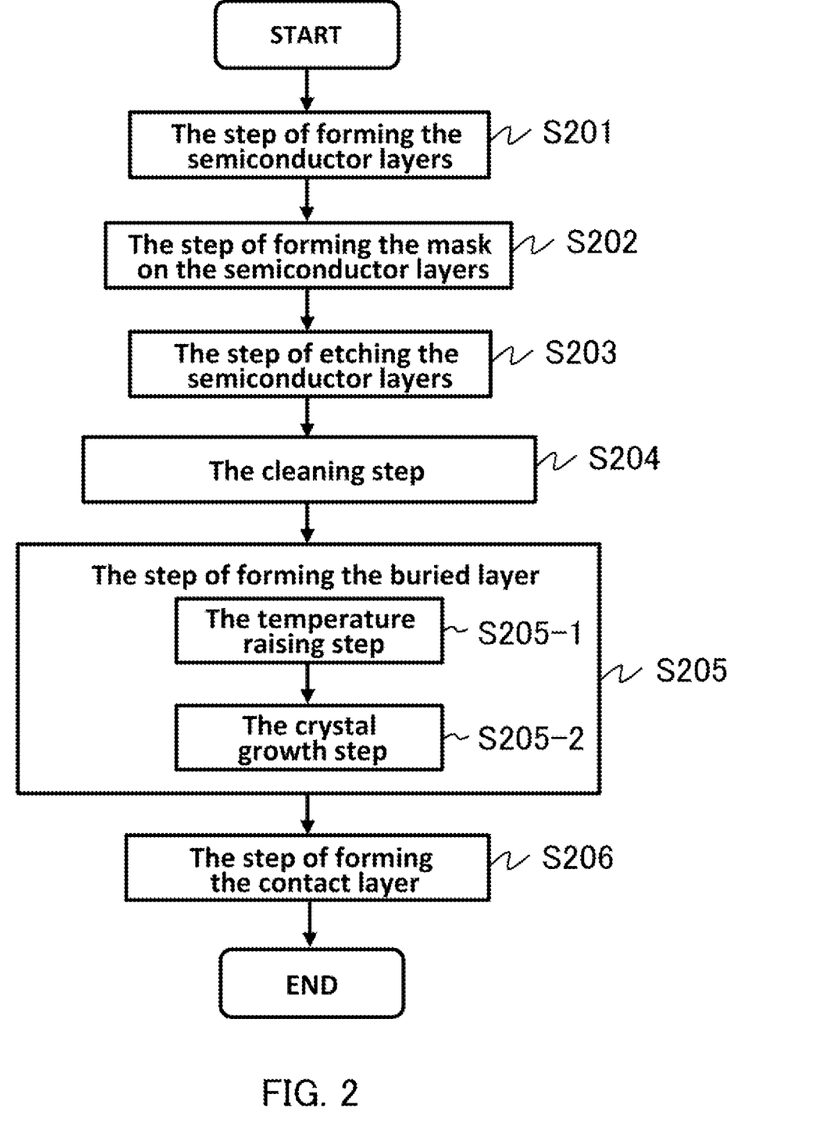
FIG. 2 is a flowchart showing steps in the method of manufacturing the optical semiconductor device according to Embodiment 1.
Figure 3:
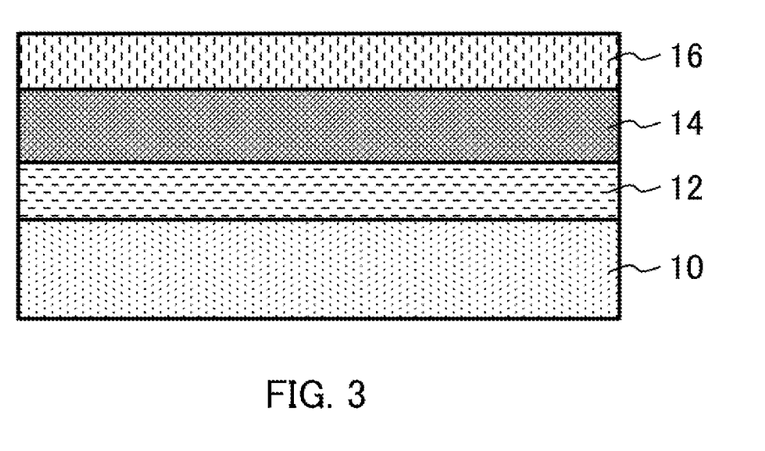
FIG. 3 is a sectional view illustrating one of the steps in the method of manufacturing the optical semiconductor device according to Embodiment 1.
Figure 4:
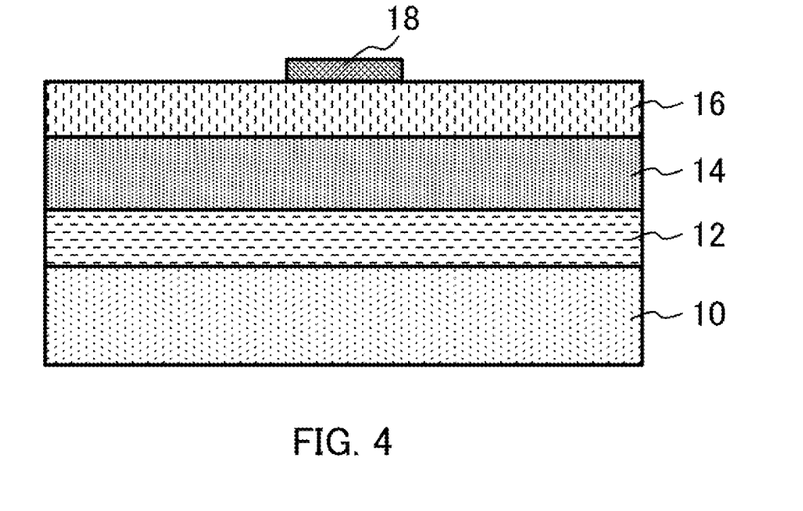
FIG. 4 is a sectional view illustrating one of the steps in the method of manufacturing the optical semiconductor device according to Embodiment 1.
Figure 5:
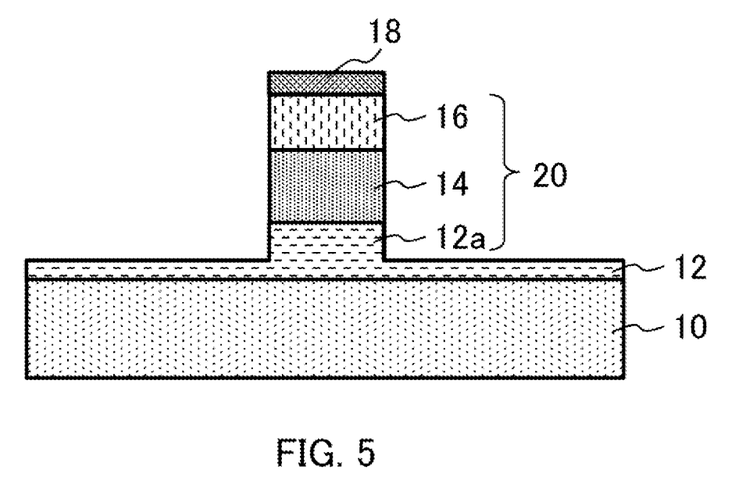
FIG. 5 is a sectional view illustrating one of the steps in the method of manufacturing the optical semiconductor device according to Embodiment 1.
Figure 6:
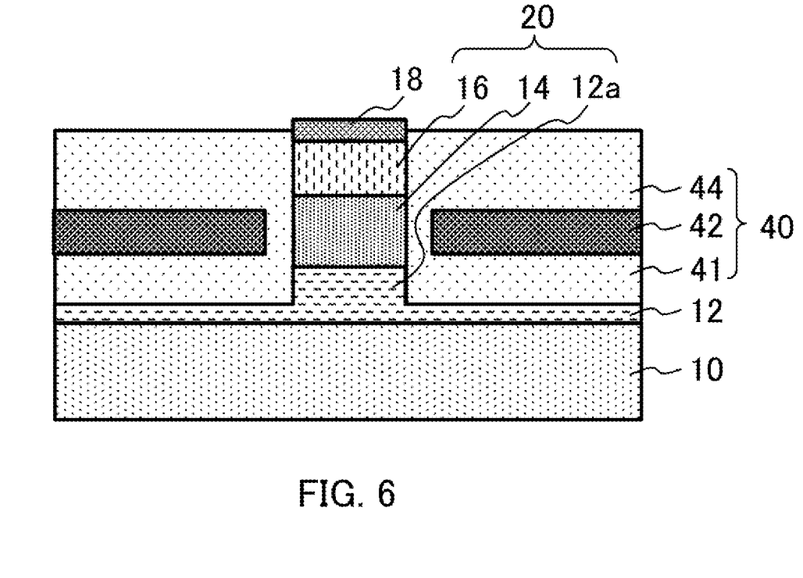
FIG. 6 is a sectional view illustrating one of the steps in the method of manufacturing the optical semiconductor device according to Embodiment 1.

Next, described is a method of manufacturing the optical semiconductor device 101 according to Embodiment 1 of the present invention. FIG. 2 is a flowchart showing steps of manufacturing the optical semiconductor device 101 having a basic structure of a semiconductor laser element, an optical semiconductor device. FIGS. 3 to 6 are sectional views of the optical semiconductor device 101 respectively illustrating the manufacturing steps corresponding to FIG. 2. FIG. 3 illustrates a step of forming the semiconductor layers on the substrate. FIG. 4 illustrates a step of forming a mask on the semiconductor layers. FIG. 5 illustrates a step of etching the semiconductor layers. FIG. 6 illustrates a step of forming the buried layers.

First, in Step S201 of FIG. 2, which is the step of forming the semiconductor layers on the substrate, the n-type InP cladding layer 12 is formed on the n-type InP substrate 10; the AlGaInAs active layer 14 is subsequently formed on the n-type InP cladding layer 12; and then the p-type InP cladding layer 16 is formed on the AlGaInAs active layer 14, using a metal organic chemical vapor deposition (MOCVD) (see FIG. 3).

Subsequently, in Step S202 of FIG. 2, which is the step of forming the mask on the semiconductor layers, after forming a $SiO_2$ layer on the p-type InP cladding layer 16, which is the top layer of the semiconductor element shown in FIG. 3, a $SiO_2$ mask 18 is formed by patterning the $SiO_2$ layer into a predetermined pattern by a photoetching using a resist pattern (see FIG. 4).

Following that, in Step S203 of FIG. 2, which is the step of etching the semiconductor layers, the wafer is transferred into the chamber of a reactive ion etching apparatus and then part of the semiconductor layers is etched using the $SiO_2$ mask 18, to form the active layer ridge 20 having vertical mesa sidewalls (see FIG. 5). The etching uses a gas that contains Si and Cl in its molecular structure and Ar gas. For example, $SiCl_4$ can be used as the gas containing Si and Cl in its molecular structure.

Conventionally, there has been the problem of production of Si residue by the etching and of adhesion of Si in the air when the etched wafer is then transferred into a chamber for crystal growth. With this being the situation, the present application has a feature in that a cleaning is performed after the etching step and before the step of forming the buried layers, with the active layer ridge 20 being kept in shape.

Subsequently, in Step S204 of FIG. 2, which is a cleaning step, the etched wafer is transferred into the chamber of an MOCVD apparatus, and then the surfaces of the semiconductor layers are cleaned, that is, Si having adhered to the sidewalls of the active layer ridge 20 and the surfaces (the bottoms of the mesa grooves) of the n-type InP cladding layer 12 (see FIG. 5).

The cleaning step is performed at a wafer temperature of, for example, 560° C. The temperature of the cleaning step is adjusted so that the crystal growth rate of the bottoms of the mesa grooves and that of the sidewalls of the ridge approximately equal to each other. Although it is described later, a temperature of, for example, 620° C. is used as an optimum temperature for the crystal growth in the next step of forming the buried layers. The temperature of the cleaning step is necessarily set lower than this temperature. This is due to the fact that unless the cleaning temperature is lower than the optimum temperature for the crystal growth, the growth rate of the bottoms of the mesa grooves and that of the sidewalls of the ridge are not equal to each other.

The cleaning step is preferably performed in a temperature range between 400° C. and 600° C. A temperature higher than 600° C. results in that the crystal growth rate of the bottoms of the mesa grooves is larger than that of the sidewalls of the ridge, and the temperature lower than 400° C., under which temperature the crystal growth is impossible, results in that only etching proceeds and the cleaning effect cannot be achieved.

If the temperature in the cleaning step is set equal to that in the step of forming the buried layers, the etching proceeds from the upper part of the ridge toward the sidewalls thereof, thus losing the shape of the ridge. The inventor of the present application established that the cause of losing the ridge shape is as follows.

At a temperature optimal to the crystal growth, the growth rate of the bottoms of the mesa grooves is larger than that of the sidewalls of the ridge. This is because the atoms of the gas fed to the sidewalls of the ridge diffuse to the bottom of the mesa grooves.

By contrast, the etching rate by the etching gas is comparable for the bottoms of the mesa grooves and the sidewalls of the ridge. When the source gas for the crystal growth and the etching gas are fed at the same time, the film thickness changing rate of the sidewalls of the ridge, which rate is subtraction of the etching rate from the growth rate, is larger in the negative direction compared to that of the bottoms of the mesa grooves.

The inventor of the present application considered the cause of the above-described problem, established by himself and found a solution thereto. Specifically, he found that the film thickness changes of the sidewalls of the ridge and the bottoms of the mesa grooves can be adjusted to be comparable to each other by performing the cleaning step at a temperature lower than the temperature optimal for the crystal growth (the temperature of the step of forming the buried layers). This mechanism can be explained as follows.

When the crystal growth is performed at a temperature lower than that optimal to the growth, the diffusion distance of the atoms become short, whereby the diffusion to the bottoms of the mesa grooves is suppressed. Consequently, the growth rates of the bottoms of the mesa grooves and the sidewalls of the ridge become comparable. The etching rate by the etching gas, on the other hand, is equal for the sidewalls of the ridge and the bottoms of the mesa grooves even at the low temperature. As a result, the film thickness changes of the sidewalls of the ridge and the bottoms of the mesa grooves become comparable to each other. Performing the cleaning at a near zero film thickness changing rate allows the Si on the surfaces of the semiconductor layers to be removed with the ridge being kept in shape and the Si concentration at the boundaries between the buried layers and the sidewalls of the ridge can be lowered to less than $1.0 \times 10^{17}/cm^3$.

Figure 7:
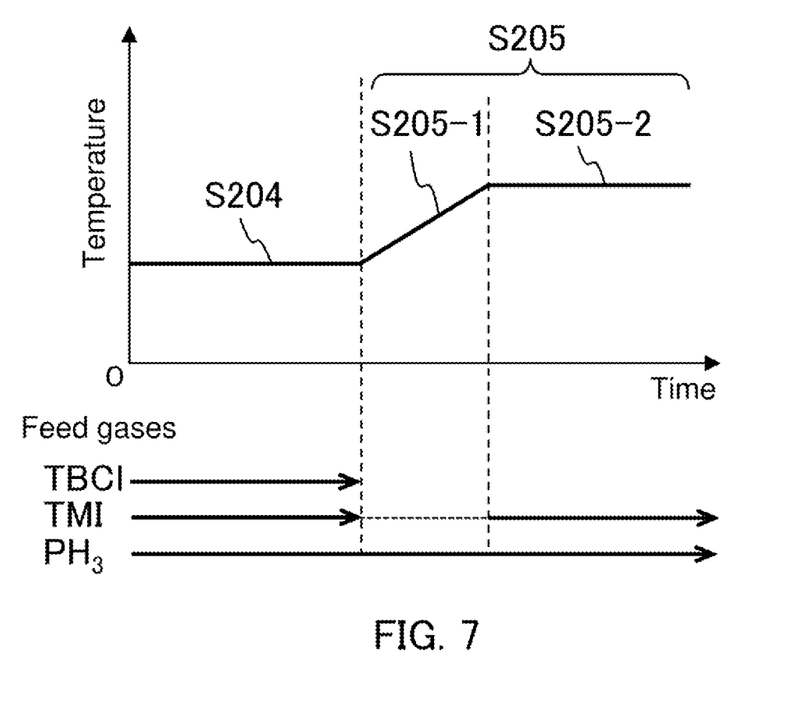
FIG. 7 is a diagram showing a relationship between a temperature profile and feed gases in the steps in the method of manufacturing the optical semiconductor device according to Embodiment 1.

FIG. 7 is a diagram showing a relationship between a temperature profile and feed gases during from the cleaning step (Step S204) to the step of forming the buried layer (Step S205).

A group-V source gas (for example, phosphine ($PH_3$)) is constantly fed during from the cleaning step to the later-described step of forming the buried layers. This is a general measure for the atoms of group V not to desorb from the surfaces of the semiconductor layers, and such a source gas of group V is constantly fed during heating of the wafer in the MOCVD apparatus.

In the cleaning step, a group-III source gas (for example, trimethyl indium (TMI: $(CH_3)_3In$) for the crystal growth and a halogen-based etching gas (for example, t-butyl chloride (TBCl: $(CH_3)_3CCl$) are fed. At this time, the feed rates of the source gas and the etching gas are adjusted so that the film thickness changes of the sidewalls of the ridge and the bottoms of the mesa grooves are near zero. By feeding the group-III source gas and the etching gas at the same time, the desorbed Si is prevented from readhering to the surfaces of the semiconductor layers, thus enabling the cleaning effect to be enhanced. Note that, the gas to be supplied is not limited to that shown in the figure, and HCl may be used as the etching gas, for example.

In Step S205 of FIG. 2, which is the step of forming the buried layers, the temperature in the MOCVD apparatus is raised from the wafer temperature in the cleaning step to, for example, 620° C. (Step S205-1) and then the buried layers are formed by crystal growth along both sidewalls of the active layer ridge 20 (Step S205-2) (see FIG. 6).

In the temperature raising step (Step S205-1), neither the group-III source gas nor the etching gas are fed and neither the crystal growth nor the etching are performed. The temperature is raised to that optimal for a semiconductor material to be crystal-grown next. An optimum temperature for the crystal growth is, for example, 600° C. to 650° C. for InP and 650° C. to 750° C. for GaAs. The optimum temperature for another semiconductor material may also be appropriately set.

In the crystal growth step (Step S205-2), the buried layers 40 is formed by sequential crystal growth of the p-type InP current blocking layer 41, the n-type InP current blocking layer 42, and the p-type InP current blocking layer 44 along both sidewalls of the active layer ridge 20 using the MOCVD.

Finally, in Step S206 of FIG. 2, which is the step of forming the contact layer, the p-type InP cladding layer 46 is formed on the surfaces of the buried layers 40 and the active layer ridge 20 using the MOCVD after removing the $SiO_2$ mask and then the p-type InGaAs contact layer 48 is formed on the surface of the p-type InP cladding layer 46 using the MOCVD. With these steps, the optical semiconductor device 101 shown in FIG. 1 is completed.

While the substrate 10 is formed of the n-type InP, employing a p-type InP also brings about the effect of the present application. In that case, the conductivity types of each cladding layer, each blocking layer, and the contact layer are opposite to the above-described ones, respectively. Furthermore, the substrate may be formed of a semi-insulating InP. In this case, the conductivity type configuration of the cladding layers on the substrate is fixed, and the conductivity type is suitably selected for each layer.

Furthermore, high resistant layers may be employed for the blocking layers. The high resistant layers are InP layers doped with, for example, Fe. Furthermore, the substrate is not limited to InP but a substrate such as formed of, for example, GaAs or GaN may be used. In this case, a GaAs-based epitaxial layer or a GaN-based epitaxial layer is appropriately used. Furthermore, the etching step may be performed using a method other than the RIE: wet etching can also be used.

Furthermore, a surface cleaning such as by a chemical treatment may be performed between the etching step and the cleaning step. Even in that case, however, since Si in the air adheres to the etched surfaces, the cleaning step of the present application is indispensable. In addition, constituent components other than those essential to the present application may be configured differently from the embodiment to meet a desired characteristics of the optical semiconductor device.

As described above, the method of manufacturing the optical semiconductor device 101 of Embodiment 1 includes the step of forming the semiconductor layers on the surface of the n-type InP substrate 10; the etching step of etching part of the semiconductor layers to form the active layer ridge 20; the cleaning step of removing Si having adhered to the etched surfaces of the semiconductor layers while feeding the source gas for the crystal growth and the etching gas; and the crystal growth step of forming the buried layers 40 along both sidewalls of the active layer ridge 20 at a processing temperature higher than that of the cleaning step, thus being able to perform the cleaning with the ridge being kept in shape.

Embodiment 2

While Embodiment 1 described the case of adjusting the film thickness changing rate to be near zero, Embodiment 2 describes a case of adjusting the film thickness changing rate to be larger than zero.

In the cleaning step for the optical semiconductor device according to Embodiment 2 of the present invention, the film thickness changing rate is adjusted to be larger than zero, for example, adjusted to 0.05 nm/sec. In this case, even though the cleaning is performed for 20 minutes to sufficiently exhibit the cleaning effect, the film thickness increases by only 60 nm. This value causes no degradation of crystallinity. The other steps of manufacturing the optical semiconductor device according to Embodiment 2 are the same as those of manufacturing the optical semiconductor device according to Embodiment 1, and their description is omitted.

It is not preferable to adjust the film thickness changing rate to be smaller than zero. This is due to the fact that if adjusting so, the film thickness of the sidewalls of the ridge and the bottoms of the mesa grooves are reduced, in particular, reduction of the film thickness of the sidewalls of the ridge leads to characteristic deterioration of the element. Hence, it is preferable to adjust the film thickness changing rate to be zero or little larger than zero considering variation of the rate.

The increased amount of the film thickness during the cleaning step is preferably more than 0 nm and smaller than 100 nm. A film thickness increase of more than 100 nm in the cleaning step leads to degradation of crystallinity due to low temperature growth.

Hence, the film thickness changing rate in the cleaning step is adjusted by setting the cleaning time and the feed rates of the source gas and the etching gas so that increased amount of the film thickness during the cleaning step ranges between 0 nm and 100 nm.

The film thickness changing rate thus larger than zero, for example, 0.05 nm/sec would allow not only for bringing about sufficient cleaning effect but also for reliably preventing from reducing the film thickness along the sidewalls of the ridge.

As described above, according to the method of manufacturing the optical semiconductor device of Embodiment 2, since the film thickness changing rate of the crystal during the cleaning step is adjusted to be larger than zero and the increased amount of the film thickness is adjusted to be in a range between 0 nm and 100 nm, the film thickness of the sidewalls of the ridge can be reliably prevented from reducing with Si concentration in the boundaries between the sidewalls of the ridge and the buried layers being lower than $1.0 \times 10^{17}/cm^3$, thus being able to manufacture the optical semiconductor device more stably.

In addition, in Embodiment 1 and Embodiment 2, a crystal growth step at a low temperature may be performed between the cleaning step and the temperature raising step. Since the low temperature growth allows the crystal to adhere steadily to the sidewalls of the ridge, the blocking layers can be stably formed. Furthermore, to achieve this purpose, the crystal growth may also be performed during the temperature raising step. However, since a thick growth of the film at such a low temperature deteriorates its crystallinity, the thickness of the film formed by the crystal growth at the low temperature and by the crystal growth during the temperature raising step is preferably less than 100 nm.

Embodiment 3

Embodiment 3 describes a case of performing the cleaning step while feeding a dopant that becomes a film whose conductivity type is different from that of the substrate.

In the cleaning step for the optical semiconductor device according to Embodiment 3 of the present application, a dopant gas that becomes a film whose conductivity type is different from that of the substrate is added to the feed gas. In a case of applying the dopant addition to the cleaning step of Embodiment 1 and Embodiment 2, the sidewalls of the ridge and the bottoms of the mesa grooves become the same conductivity type as the p-type InP current blocking layer 41 during the cleaning step, so that a desired blocking layer effect can be brought about when the buried layers 40 is formed. A dopant gas that becomes a film whose conductivity type is different from that of the substrate includes hydrogen sulfide ($H_2S$) for a case of using a p-type substrate and diethyl zinc (DEZn: $(C_2H_5)_2Zn$) for a case of using an n-type substrate; however, not limited to these, but such another gas can be employed. The other steps of manufacturing the optical semiconductor device according to Embodiment 3 are the same as those of manufacturing the optical semiconductor device according to Embodiments 1 and 2, and their description is omitted.

If an undoped film is formed in the cleaning step, the blocking layer effect is diminished and this deteriorates the characteristics of the optical semiconductor device. Contrary to this, no undoped film is formed in the cleaning step of Embodiment 3. In particular, applying the dopant addition to the cleaning step of Embodiment 2, in other words, applying it to the case of a positive film thickness changing rate leads to formation of parts of the p-type InP current blocking layer 41 and the p-type InP current blocking layer 44 in the cleaning step.

As described above, according to the method of manufacturing the optical semiconductor device of Embodiment 3, since the feed gas during the cleaning step contains a dopant gas that becomes a film whose conductivity type is different from that of the substrate, no undoped film is formed in the cleaning step, thus being able to bring about a desired blocking layer effect.

Embodiment 4

Embodiment 4 describes a case of performing the cleaning step while feeding a dopant that becomes a high resistant film.

In the cleaning step for the optical semiconductor device according to Embodiment 4 of the present application, a semi-insulating dopant gas that becomes a high resistant film is added to the feed gas. By feeding the semi-insulating dopant becoming a high resistant film during cleaning, the sidewalls of the ridge and the bottoms of the mesa grooves become high resistant, so that a desired blocking layer effect can be brought about when the buried layers are formed. The semi-insulating dopant gas becoming a high resistant film includes ferrocene ($Cp_2Fe$: $Fe(C_5H_5)_2$). Using the dopant gas, the high resistant film is formed by being doped with Fe. The other steps of manufacturing the optical semiconductor device according to Embodiment 4 is the same as those of manufacturing the optical semiconductor device according to Embodiments 1 and 2, and their description is omitted.

In Embodiment 4, employing high resistant layers for the buried layers allows for applying the present application most effectively. In this case, the blocking layers are appropriately designed such as to be also high resistant layers to meet desired characteristics of the optical semiconductor device.

As described above, according to the method of manufacturing the optical semiconductor device of Embodiment 4, since the feed gas in the cleaning step contains a semi-insulating dopant gas, the film formed in the cleaning step becomes high resistant, thus being able to bring about a desired blocking layer effect.

Although the present application describes various exemplary embodiments and implementations, it should be understood that various features and aspects and functionalities described in one or more of the individual embodiments are not limited to their applicability to the specific embodiment but instead can be applied alone or in various combinations to one or more of the embodiments. Therefore, numerous modifications that have not been exemplified are conceivable without departing from the technical scope disclosed in the specification of the present application. For example, at least one of the constituent components may be modified, added, or eliminated, and further at least one of the constituent components mentioned in at least one of the preferred embodiments may be selected and combined with the constituent elements mentioned in another preferred embodiment.

REFERENCE NUMERALS

10: n-type InP substrate;
12: n-type InP cladding layer;
12*a*: protrusion 12*a*;
14: AlGaInAs active layer;
16: p-type InP cladding layer;
20: active layer ridge;
40: buried layers;
41: p-type InP current blocking layers;
42: n-type InP current blocking layers;
44: p-type InP current blocking layers; and
101: optical semiconductor device.

The invention claimed is:

1. A method of manufacturing an optical semiconductor device, comprising:
    a step of forming semiconductor layers on a surface of a substrate;
    an etching step of forming a ridge by etching part of the semiconductor layers;
    a cleaning step of removing substances having adhered to surfaces of the etched semiconductor layers while feeding a source gas for crystal growth and an etching gas; and
    a crystal growth step of forming current blocking layers both sidewalls of the ridge at a processing temperature higher than a temperature in the cleaning step.

2. The method of manufacturing the optical semiconductor device according to claim 1, wherein a heating temperature in the cleaning step ranges between 400° C. and 600° C.

3. The method of manufacturing the optical semiconductor device according to claim 1, wherein the source gas contains a first source gas and a second source gas.

4. The method of manufacturing the optical semiconductor device according to claim 2, wherein the source gas contains a first source gas and a second source gas.

5. The method of manufacturing the optical semiconductor device according to claim 3, wherein the first source gas is fed during a temperature raising step that is performed between the cleaning step and the crystal growth step.

6. The method of manufacturing the optical semiconductor device according to claim 4, wherein the first source gas is fed during a temperature raising step that is performed between the cleaning step and the crystal growth step.

7. The method of manufacturing the optical semiconductor device according to claim 3, wherein the first source gas is a group-V gas, and the second source gas is a group-III gas.

8. The method of manufacturing the optical semiconductor device according to claim 4, wherein the first source gas is a group-V gas, and the second source gas is a group-III gas.

9. The method of manufacturing the optical semiconductor device according to claim 5, wherein the first source gas is a group-V gas, and the second source gas is a group-III gas.

10. The method of manufacturing the optical semiconductor device according to claim 6, wherein the first source gas is a group-V gas, and the second source gas is a group-III gas.

11. The method of manufacturing the optical semiconductor device according to claim 7, wherein the etching gas is a halogen-based gas.

12. The method of manufacturing the optical semiconductor device according to claim 8, wherein the etching gas is a halogen-based gas.

13. The method of manufacturing the optical semiconductor device according to claim 9, wherein the etching gas is a halogen-based gas.

14. The method of manufacturing the optical semiconductor device according to claim 10, wherein the etching gas is a halogen-based gas.

15. The method of manufacturing the optical semiconductor device according to claim 1, wherein a changing rate of a film thickness of a crystal formed in the cleaning step is larger than zero and an increased amount of the film thickness ranges between 0 nm and 100 nm.

16. The method of manufacturing the optical semiconductor device according to claim 2, wherein a changing rate of a film thickness of a crystal formed in the cleaning step is larger than zero and an increased amount of the film thickness ranges between 0 nm and 100 nm.

17. The method of manufacturing the optical semiconductor device according to claim 1, wherein the gases fed in the cleaning step contain a dopant gas that becomes a film whose conductive type is different from a conductive type of the substrate.

18. The method of manufacturing the optical semiconductor device according to claim 2, wherein the gases fed in the cleaning step contain a dopant gas that becomes a film whose conductive type is different from a conductive type of the substrate.

19. The method of manufacturing the optical semiconductor device according to claim 1, wherein the gases fed in the cleaning step contain a semi-insulating dopant gas.

20. The method of manufacturing the optical semiconductor device according to claim 2, wherein the gases fed in the cleaning step contain a semi-insulating dopant gas.

* * * * *